(12) United States Patent
Dai et al.

(10) Patent No.: US 8,538,349 B2
(45) Date of Patent: Sep. 17, 2013

(54) METHOD AND DEVICE FOR PRE-DISTORTING AN EXCITER AND PREDISTORTION EXCITER

(75) Inventors: Qingyu Dai, Beijing (CN); Anmou Liao, Beijing (CN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 195 days.

(21) Appl. No.: 13/228,798

(22) Filed: Sep. 9, 2011

(65) Prior Publication Data

US 2012/0063544 A1 Mar. 15, 2012

(30) Foreign Application Priority Data

Sep. 10, 2010 (CN) .......................... 2010 1 0289013

(51) Int. Cl.
*H04B 1/04* (2006.01)
*H03C 1/62* (2006.01)

(52) U.S. Cl.
USPC ............... 455/114.3; 455/63.1; 455/67.13; 455/115.3; 375/296

(58) Field of Classification Search
USPC ............ 455/63.1, 67.13, 114.2, 114.3, 115.1, 455/115.3; 375/296, 297
See application file for complete search history.

(56) References Cited

U.S. PATENT DOCUMENTS

| | | | | |
|---|---|---|---|---|
| 4,249,214 A | * | 2/1981 | Boyd | 455/116 |
| 5,023,937 A | * | 6/1991 | Opas | 455/126 |
| 6,882,221 B2 | | 4/2005 | Schreyer et al. | |
| 7,085,330 B1 | | 8/2006 | Shirali | |
| 7,671,588 B2 | | 3/2010 | Cao et al. | |
| 8,280,312 B2 | * | 10/2012 | Boe et al. | 455/67.11 |

\* cited by examiner

*Primary Examiner* — Quochien B Vuong
(74) *Attorney, Agent, or Firm* — Armstrong Teasdale LLP

(57) ABSTRACT

A method for pre-distorting an exciter includes obtaining a characteristic curve of a radio frequency (RF) amplifier, obtaining a first relationship between a gain amplitude correction value and an input power and a second relationship between a gain phase correction value and the input power based on the characteristic curve, obtaining a transmission gain for use in a scan from a magnetic resonance pre-scan, and obtaining the gain amplitude correction value and the gain phase correction value of an input of the exciter based on the input of the exciter, the transmission gain, the first relationship, and the second relationship. An input of the exciter is pre-distorted using the gain amplitude correction value and the gain phase correction value.

20 Claims, 4 Drawing Sheets

METHOD AND DEVICE FOR PRE-DISTORTING AN EXCITER AND PREDISTORTION EXCITER

CROSS REFERENCE TO RELATED APPLICATIONS

This application claims the benefit of Chinese Patent Application No. 201010289013.7 filed Sep. 10, 2010, which is hereby incorporated by reference in its entirety.

BACKGROUND OF THE INVENTION

The embodiments described herein generally relate to the magnetic resonance (MR) field, in particular to a method and device for pre-distorting an exciter as well as to a predistortion exciter.

In a known MR system, the radio frequency (RF) amplifier outputs the RF excitation which generates a B1 field. However, due to the nonlinearity of the RF amplifier, the actual output of the RF amplifier will have a distortion as compared to the input, leading to a poor profile of a slice. That is, in the MR system, the RF amplifier has a more complicated distortion, thus the profile of the slice is different from that in the ideal case.

At present, researchers have provided some methods to solve the above-mentioned problems.

For example, U.S. Pat. No. 6,882,221 discloses an apparatus and a corresponding method for predistorting an input signal applied to a radio frequency (RF) power amplifier to compensate for distortion of the amplifier at high powers. The input and output signals of the RF amplifier are continuously monitored and difference signals are generated in an RF phase discriminator. The difference signals are then converted to digital form and stored in a lookup table in the form of running averages of again compression value of the RF amplifier and an output phase value of the RF amplifier for each observed RF input power value. A predistorter module retrieves these values and predistorts the input of the RF amplifier by way of compensation. This patent focuses on applying the predistortion at carrier frequency rather than at baseband, and does not consider how to apply predistortion at a system level.

The U.S. Pat. No. 7,085,330 discloses a method and apparatus for linearization of an amplifier using adaptive predistortion, wherein a signal processing method and apparatus capable of correcting signal distortion introduced by an RF power amplifier is disclosed. The apparatus includes a buffer to store a plurality of samples representing at least a portion of an input signal to be amplified by the RF power amplifier, a receiver to receive an output signal generated by the RF power amplifier, a synchronization unit to determine, as a matching input sample, which of the stored plurality of samples corresponds most closely to the output signal, and a predistortion unit to selectively apply a distortion correction function to the input signal prior to amplification by the RF power amplifier. The distortion correction function is derived from a relationship between the matching input sample and the output signal. This enables more precise and updateable determination of the delays involved in the RF modulation and amplification stages of the amplifier and the self-receiver. A phase offset correction is optionally provided to correct a phase offset in the realized sample of the output signal relative to the matching input symbol. Additionally, a sampling phase error correction unit may be provided to generate sampling alteration information to an analog-to-digital converter to cause such analog-to-digital converter to selectively alter sampling of the output signal. This patent recites the method and apparatus for use in the wireless communication, but it does not mention using them in the MR field.

BRIEF DESCRIPTION OF THE INVENTION

The embodiments described herein provide a method and device for pre-distorting an exciter as well as a predistortion exciter.

The herein-described method for pre-distorting the exciter includes obtaining a characteristic curve of a RF amplifier, obtaining the relationship between the gain amplitude correction value and the input power and the relationship between the gain phase correction value and the input power based on the characteristic curve, obtaining the transmission gain to be used in the scan from the MR pre-scan, and obtaining the gain amplitude correction value and gain phase correction value of the input of the exciter based on the input of the exciter, the transmission gain, the relationship between the gain amplitude correction value and the input power, and the relationship between the gain phase correction value and the input power. The input of the RF exciter is pre-distorted using the gain amplitude correction value and the gain phase correction value.

Preferably, the relationship between the gain amplitude correction value and the input power may be obtained through iterating the following equation:

$$Cor(Pin)+G_x[Pin+Cor(Pin)]=0$$

wherein, Pin represents the input power; Cor(Pin) represents the gain amplitude correction value corresponding to Pin; and $G_x[Pin+Cor(Pin)]$ represents the gain amplitude of the amplifier corresponding to the corrected power.

Preferably, the relationship between the gain phase correction value and the input power can be obtained through the following equation:

$$C_{PS}(Pin)+P_x[Pin+Cor(Pin)]=0$$

wherein, Pin represents the input power; $C_{PS}(Pin)$ represents the gain phase correction value corresponding to Pin; and $P_x[Pin+Cor(Pin)]$ represents the phase of the amplifier corresponding to the corrected power.

Further, the relationship between the gain amplitude correction value and the input power as well as the relationship between the gain phase correction value and the input power are stored in the exciter.

Preferably, the relationship between the gain amplitude correction value and the input power and the relationship between the gain phase correction value and the input power are stored in the form of a lookup table.

Correspondingly, the herein-described device for pre-distorting the exciter includes a unit for obtaining a characteristic curve of an amplifier, a unit for obtaining the relationship between the gain amplitude correction value and the input power and the relationship between the gain phase correction value and the input power based on the characteristic curve, a unit for obtaining the transmission gain to be used in the scan from the MR pre-scan, and a unit for obtaining the gain amplitude correction value and gain phase correction value of the input of the exciter based on the input of the exciter, the transmission gain, the relationship between the gain amplitude correction value and the input power, and the relationship between the gain phase correction value and the input power. The device further includes a unit for pre-distorting the input of the RF exciter using the gain amplitude correction value and the gain phase correction value.

Preferably, the relationship between the gain amplitude correction value and the input power may be obtained through iterating the following equation:

$$Cor(Pin)+G_x[Pin+Cor(Pin)]=0$$

wherein, Pin represents the input power; Cor(Pin) represents the gain amplitude correction value corresponding to Pin; and $G_x[Pin+Cor(Pin)]$ represents the gain amplitude of the amplifier corresponding to the corrected power.

Preferably, the relationship between the gain phase correction value and the input power can be obtained through the following equation:

$$C_{PS}(Pin)+P_x[Pin+Cor(Pin)]=0$$

wherein, Pin represents the input power; $C_{PS}(Pin)$ represents the gain phase correction value corresponding to Pin; and $P_x[Pin+Cor(Pin)]$ represents the phase of the amplifier corresponding to the corrected power.

The relationship between the gain amplitude correction value and the input power as well as the relationship between the gain phase correction value and the input power are stored in the exciter.

Preferably, the relationship between the gain amplitude correction value and the input power and the relationship between the gain phase correction value and the input power are stored in the form of a lookup table.

In addition, the herein-described predistortion exciter includes a direct digital frequency synthesizer, a modulator, a mixer, a transmission chain gain amplifier, a pre-distorter and an adder. The relationship between the gain amplitude correction value and the input power as well as the relationship between the gain phase correction value and the input power are stored in the pre-distorter. The pre-distorter is configured to obtain the gain amplitude correction value and gain phase correction value of the predistortion exciter based on the input of the predistortion exciter, the transmission gain as well as the relationship between the gain amplitude correction value and the input power and the relationship between the gain phase correction value and the input power. The gain phase correction value obtained and the input of the predistortion exciter are used as the input of the adder, and the output of the adder is used as an input of the direct digital frequency synthesizer. The output of the direct digital frequency synthesizer is connected to an input of the modulator, and the amplitude of the input of the predistortion exciter that has been corrected by the gain amplitude correction value is used as another input of the modulator. The output of the modulator is sent to the mixer. The output of the mixer is multiplied by the transmission gain to be used in the scan and obtained from the MR pre-scan so as to be used as the output of the predistortion exciter.

Preferably, the relationship between the gain amplitude correction value and the input power may be obtained through iterating the following equation:

$$Cor(Pin)+G_x[Pin+Cor(Pin)]=0$$

wherein, Pin represents the input power; Cor(Pin) represents the gain amplitude correction value corresponding to Pin; and $G_x[Pin+Cor(Pin)]$ represents the gain amplitude of the amplifier corresponding to the corrected power.

Preferably, the relationship between the gain phase correction value and the input power can be obtained through the following equation:

$$C_{PS}(Pin)+P_x[Pin+Cor(Pin)]=0$$

wherein, Pin represents the input power; $C_{PS}(Pin)$ represents the gain phase correction value corresponding to Pin; and $P_x[Pin+Cor(Pin)]$ represents the phase of the amplifier corresponding to the corrected power.

Further, the relationship between the gain amplitude correction value and the input power and the relationship between the gain phase correction value and the input power are stored in the form of a lookup table.

Compared to the prior art, the method and device for pre-distorting an exciter and the predistortion exciter described herein have following advantages.

Because predistortion is applied to the input of the exciter, corrected signals can be output so that linearization of the exciter and amplifier can be realized, which improves the performance of the transmission chain of the nuclear magnetic resonance system.

BRIEF DESCRIPTION OF THE DRAWINGS

To better thorough understanding of the present disclosure, reference is made to the following descriptions taken in connection with the drawings, wherein.

DETAILED DESCRIPTION OF THE INVENTION

The specific embodiments of the present invention will be described in detail below, but the present invention is not limited to the following specific embodiments.

Predistortion processing is performed on the input of the exciter such that the output of the exciter (i.e. as the input of the amplifier) is processed in advance to realize linearization of the output of the exciter and the amplifier.

Figure 1:
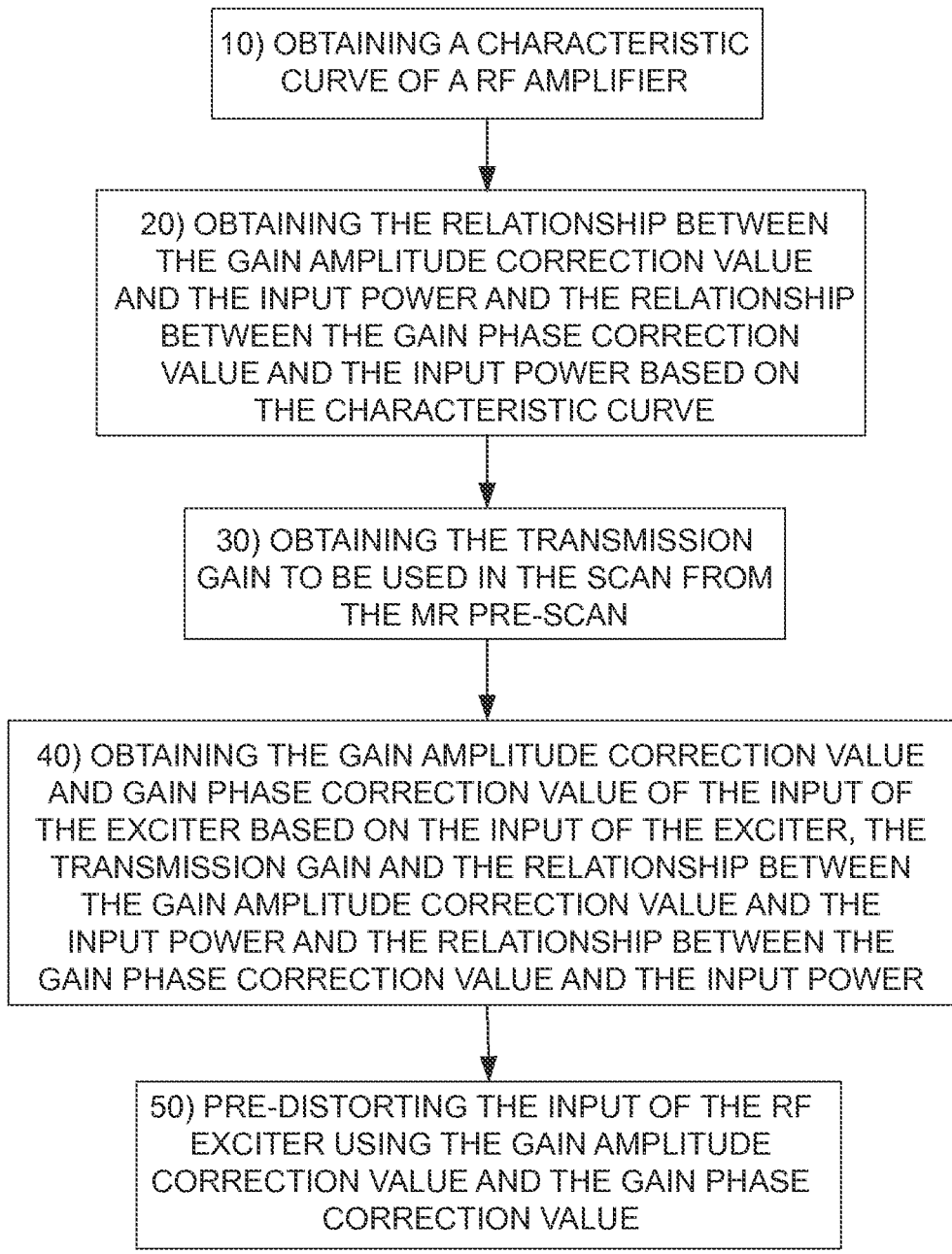
FIG. 1 is a flow chart of an exemplary method for pre-distorting an exciter.

As shown in FIG. 1, the method for pre-distorting an exciter includes 10) obtaining a characteristic curve of a RF amplifier; 20) obtaining the relationship between the gain amplitude correction value and the input power and the relationship between the gain phase correction value and the input power based on the characteristic curve; 30) obtaining the transmission gain to be used in the scan from the pre-scan of MR system; 40) obtaining the gain amplitude correction value and gain phase correction value of the input of the exciter according to the input of the exciter, the transmission gain, the relationship between the gain amplitude correction value and the input power, and the relationship between the gain phase correction value and the input power; and 50) pre-distorting the input of the RF exciter using the gain amplitude correction value and the gain phase correction value.

Figure 2:
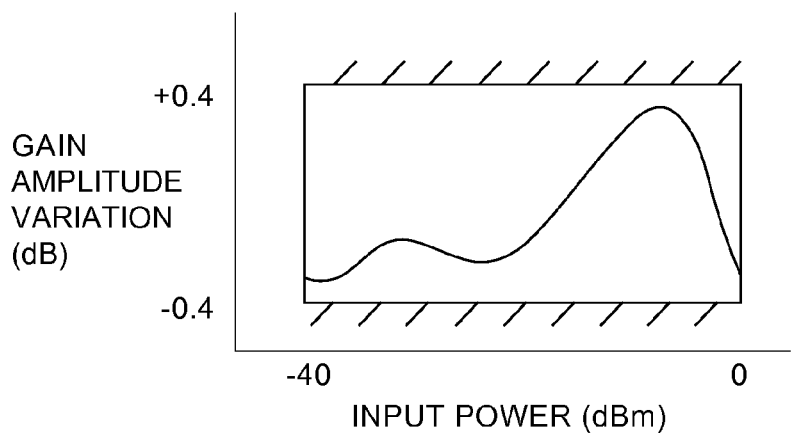
FIG. 2 is a schematic diagram of the relationship between the gain amplitude and the input power of an amplifier.
Figure 3:
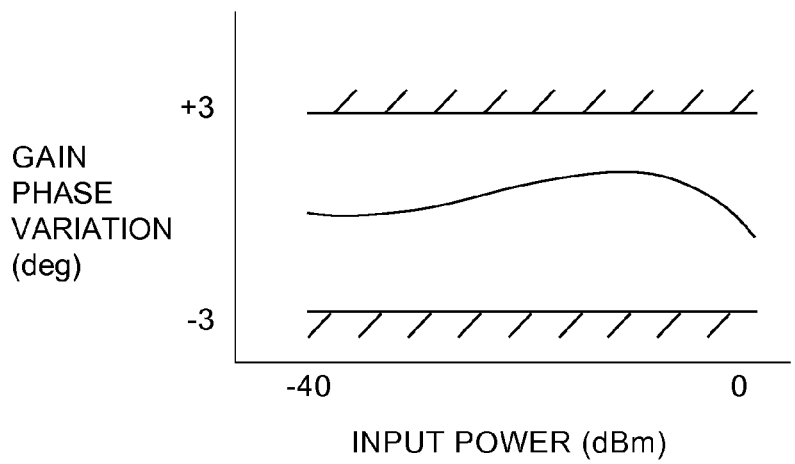
FIG. 3 is a schematic diagram of the relationship between the gain phase and the input power of an amplifier.

It can be seen that the method obtains the characteristic curve of the amplifier first. The characteristic curve includes the relationship between the gain amplitude and the input power as well as the relationship between the gain phase and the input power, which can be obtained when manufacturing the amplifier (e.g. by comparing the input and output signals of the amplifier using a vector signal analyzer). FIGS. 2 and 3 show the relationship between the gain amplitude variation and the input power of an amplifier and the relationship between the gain phase variation and the input power of an amplifier, respectively. The ideal state is that the gain amplitude variation and phase variation of the amplifier are both zero when the input power changes. However, due to non-linearity of the actual amplifier, the gain amplitude and gain phase of the amplifier will change with the input power.

Then, the relationship between the gain amplitude correction value and the input power and the relationship between the gain phase correction value and the input power are obtained based on the characteristic curve. The transmission gain to be used in the scan is obtained from the pre-scan of MR system. The gain amplitude correction value and gain phase correction value of the input of the exciter can be obtained according to the input of the exciter, the transmission gain, the relationship between the gain amplitude correction value and the input power, and the relationship between the gain phase correction value and the input power. The input of the exciter is pre-distorted using the gain amplitude correction value and the gain phase correction value. That is, the input of the exciter is pre-distorted and output to the amplifier, thereby achieving linearization of the exciter and the amplifier.

The relationship between the gain amplitude correction value and the input power may be obtained through iterating the following equation:

$$Cor(Pin)+G_X[Pin+Cor(Pin)]=0 \qquad \text{Eq. (1)}$$

wherein, Pin represents the input power; Cor(Pin) represents the correction value corresponding to Pin; and $G_X$[Pin+Cor(Pin)] represents the gain amplitude of the amplifier corresponding to the corrected power.

Equation (1) is obtained based on the following.

For $G(Pin)=G_0+G_X(Pin)$, wherein G(Pin) represents the corresponding gain of the amplifier when the input power is Pin; $G_0$ represents the constant term of the amplifier gain; and $G_X(Pin)$ represents the term associated with the input power in the amplifier gain.

Moreover, for $$Pout=Pin+Cor(Pin)+G_0+G_X[Pin+Cor(Pin)] \qquad \text{Eq. (2)}$$

wherein, Pout represents the output of the amplifier.

In addition, if the amplifier has linearity, equation (3) should be met:

$$Pout=Pin+G_0 \qquad \text{Eq. (3)}$$

Therefore, from equations (2) and (3), equation (1) can be derived such that $Cor(Pin)+G_X[Pin+Cor(Pin)]=0$.

If the amplifier remains linear, when the input power changes, the gain phase should remain unchanged. Thus the relationship between the gain phase correction value and the input power can be obtained from the following equation:

$$C_{PS}(Pin)+P_X[Pin+Cor(Pin)]=0 \qquad \text{Eq. (4)}$$

wherein, Pin represents the input power; $C_{PS}$(Pin) represents the gain phase correction value corresponding to Pin; and $P_X$[Pin+Cor(Pin)] represents the phase of the amplifier corresponding to the corrected power.

The above is only an example of obtaining the relationship between the gain amplitude correction value and the input power and the relationship between the gain phase correction value and the input power, but the relationships can be obtained by any way that is known to those skilled in the art.

As for the obtained relationship between the gain amplitude correction value and the input power and the relationship between the gain phase correction value and the input power, the relationships can be stored in the exciter and can be stored in the form of a lookup table, or in any other form known to those skilled in the art.

The method for pre-distorting an exciter is described in detail below using an amplifier in a certain practical application as an example.

Figure 4:
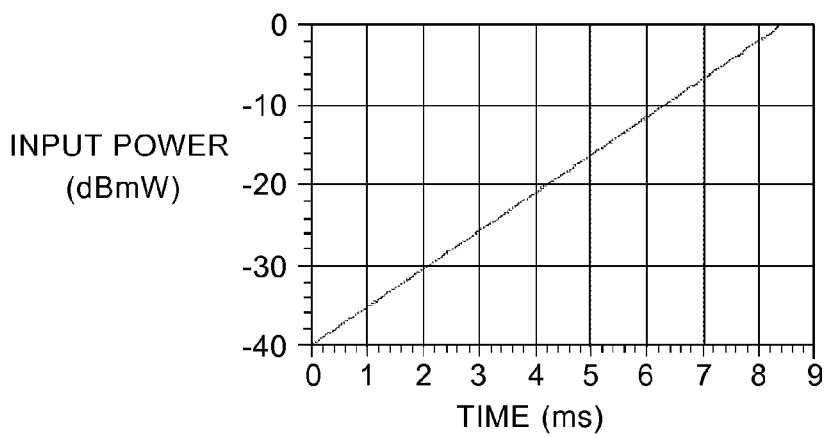
FIG. 4 is a schematic diagram of a kind of waveform of the input of the amplifier.
Figure 5:
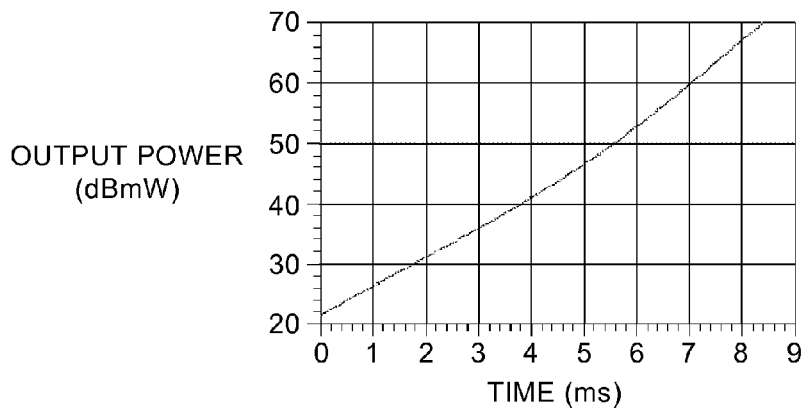
FIG. 5 is a schematic diagram of a kind of un-calibrated waveform of the output of the amplifier.

First, FIGS. 2 and 3 show the characteristic curves thereof, and FIGS. 4 and 5 respectively show the schematic diagram of waveform of the input power of the amplifier and the schematic diagram of the waveform of the un-calibrated output power of the amplifier. It can be seen from FIGS. 4 and 5 that the input of the amplifier increases linearly over time, but the output thereof is non-linear.

The following table provides an example of calculating the gain amplitude correction data Cor(Pin) and the gain phase correction data $C_{PS}$(Pin) based on Pin, $G_X$(Pin) and $P_X$(Pin).

TABLE 1

| Pin | −18.00 | −17.00 | −16.00 | −15.00 | −14.00 | −13.00 | −12.00 | −11.00 | −10.00 | −9.00 |
|---|---|---|---|---|---|---|---|---|---|---|
| Gx(Pin) | −7.63 | −7.44 | −7.21 | −6.96 | −6.66 | −6.34 | −5.97 | −5.58 | −5.15 | −4.69 |
| Px(Pin) | −1.10 | −1.10 | −1.10 | −1.00 | −0.90 | −0.75 | −0.58 | −0.46 | −0.38 | −0.25 |
| Cor(Pin) | 5.98 | 5.70 | 5.41 | 5.10 | 4.79 | 4.46 | 4.13 | 3.79 | 3.44 | 3.09 |
| Pin + Cor(Pin) | −12.02 | −11.30 | −10.59 | −9.90 | −9.21 | −8.54 | −7.87 | −7.21 | −6.56 | −5.91 |
| Px[Pin + Cor(pin)] | −0.61 | −0.53 | −0.44 | −0.36 | −0.28 | −0.21 | −0.14 | −0.08 | −0.04 | −0.04 |
| Cps(Pin) | 0.61 | 0.53 | 0.44 | 0.36 | 0.28 | 0.21 | 0.14 | 0.08 | 0.04 | 0.04 |

| Pin | −8.00 | −7.00 | −6.00 | −5.00 | −4.00 | −3.00 | −2.00 | −1.00 | 0.00 |
|---|---|---|---|---|---|---|---|---|---|
| Gx(Pin) | −4.20 | −3.68 | −3.15 | −2.60 | −2.05 | −1.50 | −0.97 | −0.46 | 0.00 |
| Px(Pin) | −0.20 | −0.10 | 0.00 | −0.15 | −0.35 | −1.30 | −2.70 | −5.00 | −9.00 |
| Cor(Pin) | 2.74 | 2.39 | 2.03 | 1.68 | 1.32 | 0.98 | 0.64 | 0.31 | 0.00 |
| Pin + Cor(Pin) | −5.26 | −4.61 | −3.97 | −3.32 | −2.68 | −2.02 | −1.36 | −0.69 | 0.00 |
| Px[Pin + Cor(pin)] | −0.09 | −0.23 | −0.48 | −0.92 | −1.59 | −2.60 | −4.05 | −6.10 | −8.98 |
| Cps(Pin) | 0.09 | 0.23 | 0.48 | 0.92 | 1.59 | 2.60 | 4.05 | 6.10 | 8.98 |

It can be seen for the above table that Cor(Pin)+Gx(Pin+Cor(Pin)) is almost zero. For example, Gx[−18.00+Cor(−18.00)]+Cor(−18.00)=Gx(−12)+Cor(−18.00)=−5.97+5.98=0.01. Likewise, for phase correction, Cps(pin)+Px(Pin+Cor(Pin))=0.

Figure 6:
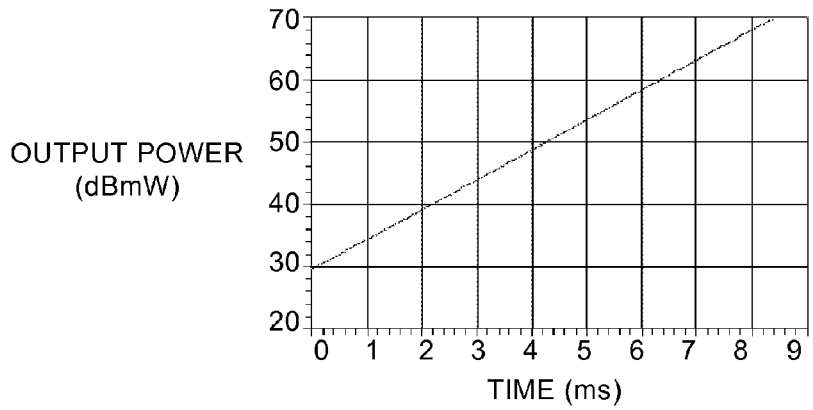
FIG. 6 is a schematic diagram of a calibrated waveform of the output of the amplifier.

A linear output of the amplifier is obtained when applying the obtained gain amplitude correction value and gain phase correction value to the exciter, as shown in FIG. 6.

Correspondingly, a device for predistorting an exciter includes a unit for obtaining the characteristic curve of the RF amplifier, a unit for obtaining the relationship between the gain amplitude correction value and the input power and the relationship between the gain phase correction value and the input power based on the characteristic curve, a unit for obtaining the transmission gain to be used in the scan from the MR pre-scan, and a unit for obtaining the gain amplitude correction value and gain phase correction value of the input of the exciter based on the input of the exciter, the transmission gain, the relationship between the gain amplitude correction value and the input power, and the relationship between the gain phase correction value and the input power. The device further includes a unit for pre-distorting the input of the RF exciter using the gain amplitude correction value and the gain phase correction value.

The relationship between the gain amplitude correction value and the input power may be obtained through iterating the following equation:

$$\text{Cor}(Pin) + G_x[Pin + \text{Cor}(Pin)] = 0 \quad \text{Eq. (1)}$$

wherein, Pin represents the input power; Cor(Pin) represents the gain amplitude correction value corresponding to Pin; and $G_x[Pin + \text{Cor}(Pin)]$ represents the gain amplitude of the amplifier corresponding to the corrected power.

The relationship between the gain phase correction value and the input power can be obtained through the following equation:

$$C_{PS}(Pin) + P_X[Pin + \text{Cor}(Pin)] = 0 \quad \text{Eq. (4)}$$

wherein, Pin represents the input power; $C_{PS}(Pin)$ represents the gain phase correction value corresponding to Pin; and $P_X[Pin + \text{Cor}(Pin)]$ represents the phase of the amplifier corresponding to the corrected power.

The relationship between the gain amplitude correction value and the input power as well as the relationship between the gain phase correction value and the input power can be stored in the exciter. The relationship between the gain amplitude correction value and the input power and the relationship between the gain phase correction value and the input power are stored in the form of a lookup table.

The device for pre-distorting an exciter corresponds to the method for pre-distorting the exciter, thus the device for pre-distorting an exciter will not be described in detail any more.

Figure 7:
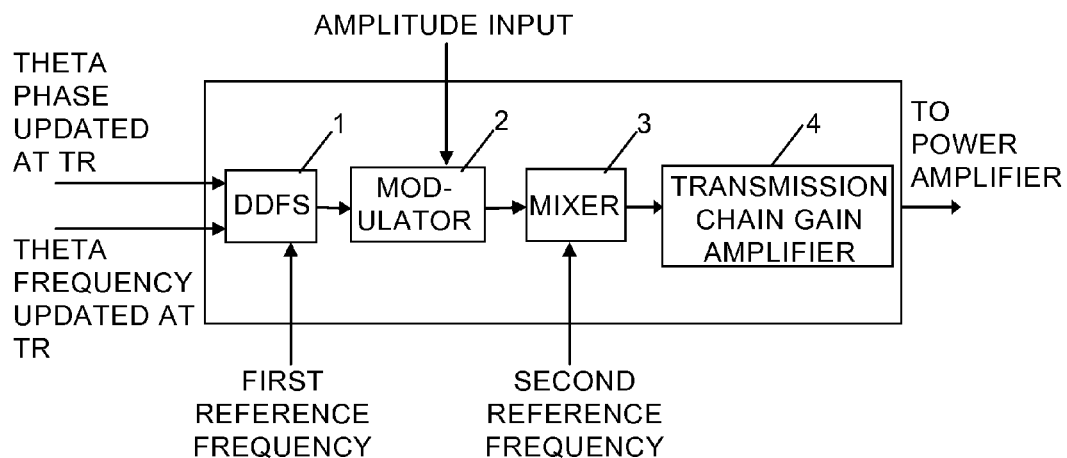
FIG. 7 is a schematic diagram of the structure of the exciter according to the prior art.

As shown in FIG. 7, the exciter of the prior art includes a digital frequency synthesizer (DDFS) 1, a modulator 2, a mixer 3, and a transmission chain gain amplifier 4. The phase of the input signal of the exciter serves as an input of DDFS 1, and the amplitude thereof serves as an input of modulator 2. Under the effect of the sine wave whose center frequency is the first reference frequency, DDFS 1 outputs sine signals of low frequency, whose frequency and phase are controlled by the input of the digital frequency synthesizer. After being modulated by the modulator 2, the sine signals are mixed in the mixer 3 with the sine signals whose center frequency is the second reference frequency, then the center frequency is modulated to the exciting frequency and is output to the RF power amplifier through the transmission chain gain amplifier 4.

Figure 8:
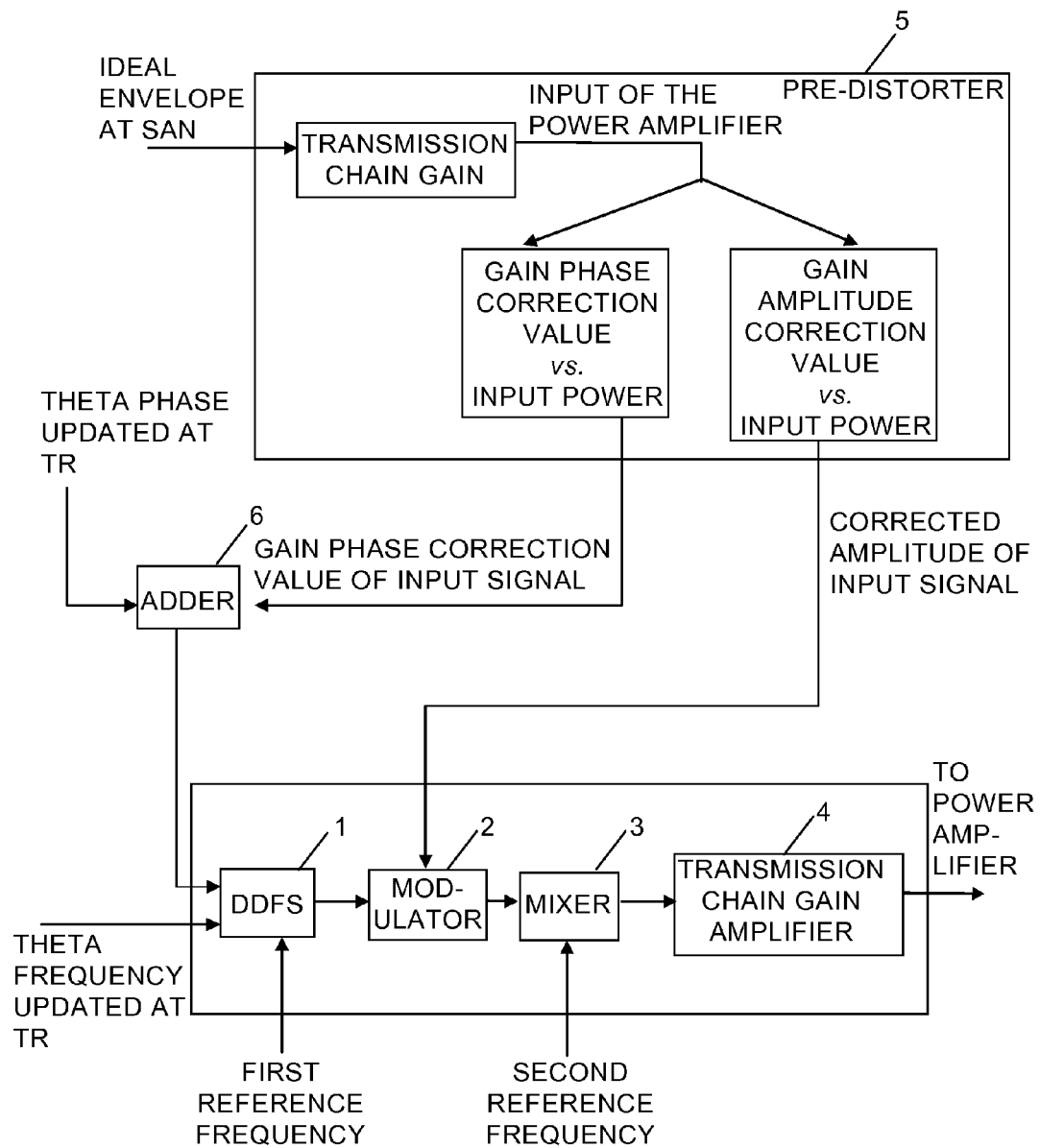
FIG. 8 is schematic diagram of an exemplary structure of the exciter.

As shown in FIG. 8, which shows the schematic diagram of an exemplary embodiment of the predistortion exciter. The predistortion exciter includes a digital frequency synthesizer (DDFS) 1, a modulator 2, a mixer 3, a transmission chain gain amplifier 4, a predistorter 5, and an adder 6. The relationship between the gain amplitude correction value and the input power and the relationship between the gain phase correction value and the input power are stored in the predistorter 5. The predistorter 5 is configured to obtain the gain amplitude correction value and gain phase correction value of the input of the predistortion exciter based on the input of the predistortion exciter, the transmission gain as well as the relationship between the gain amplitude correction value and the input power and the relationship between the gain phase correction value and the input power. The obtained gain phase correction value and the input of the predistortion exciter are used as the input of the adder 6, and the output of the adder 6 is used as one input of the direct digital frequency synthesizer 1. The output of the direct digital frequency synthesizer 1 is connected to one input of the modulator 2, and the amplitude of the input of the predistortion exciter corrected by the gain amplitude correction value is used as another input of the modulator 2. The output of the modulator 2 is sent to the mixer 3. The output of the mixer 3 is multiplied by the transmission gain to be used in the scan and obtained from the MR pre-scan so as to be used as the output of the predistortion exciter, i.e. to be sent to the amplifier.

As for the first reference frequency and the second reference frequency, the functions thereof are the same as those described in conjunction with FIG. 7, so they will not be elaborated any more.

The relationship between the gain amplitude correction value and the input power may be obtained through iterating the following equation:

$$\text{Cor}(Pin) + G_x[Pin + \text{Cor}(Pin)] = 0 \quad \text{Eq. (1)}$$

wherein, Pin represents the input power; Cor(Pin) represents the gain amplitude correction value corresponding to Pin; and $G_x[Pin + \text{Cor}(Pin)]$ represents the gain amplitude of the amplifier corresponding to the corrected power.

The relationship between the gain phase correction value and the input power can be obtained through the following equation:

$$C_{PS}(Pin) + P_X[Pin + \text{Cor}(Pin)] = 0 \quad \text{Eq. (4)}$$

wherein, Pin represents the input power; $C_{PS}(Pin)$ represents the gain phase correction value corresponding to Pin; and $P_X[Pin + \text{Cor}(Pin)]$ represents the phase of the amplifier corresponding to the corrected power.

Further, the relationship between the gain amplitude correction value and the input power and the relationship between the gain phase correction value and the input power are stored in the form of a lookup table.

For example, it is assumed that the amplifier having a characteristic curve as shown in FIGS. 2 and 3 is to be linearized, and that the first reference frequency is 16.14 MHz, the second reference frequency is 80 MHz, and the relationship between the gain amplitude correction value and the input power and the relationship between the gain phase correction value and the input power in the predistorter 5 are as shown in table 1, then the use of the predistortion exciter can achieve the function of linearization of the amplifier, as shown in FIG. 6.

Although the specific embodiments of the present invention have been described above in conjunction with the drawings, those skilled in the art can make various changes, modifications and equivalent substitution to the present invention without departing from the spirit and scope of the present invention. Such changes, modifications and equivalent substitution should be intended to fall within the spirit and scope defined by the appended claims.

What is claimed is:

1. A method for pre-distorting an exciter, the method comprising:
    obtaining a characteristic curve of a radio frequency (RF) amplifier;
    obtaining a first relationship between a gain amplitude correction value and an input power and a second relationship between a gain phase correction value and the input power based on the characteristic curve;
    obtaining a transmission gain for use in a scan from a magnetic resonance pre-scan;

obtaining the gain amplitude correction value and the gain phase correction value of an input of the exciter based on the input of the exciter, the transmission gain, the first relationship, and the second relationship; and pre-distorting an input of the exciter using the gain amplitude correction value and the gain phase correction value.

2. The method according to claim 1, wherein the first relationship is obtained through iterating the following equation:

$$\text{Cor}(Pin)+G_x[Pin+\text{Cor}(Pin)]=0$$

wherein, Pin represents the input power; Cor(Pin) represents the gain amplitude correction value corresponding to Pin; and $G_x[Pin+\text{Cor}(Pin)]$ represents a gain amplitude of the RF amplifier corresponding to a corrected power.

3. The method according to claim 2, wherein the second relationship is obtained through the following equation:

$$C_{PS}(Pin)+P_X[Pin+\text{Cor}(Pin)]=0$$

wherein, Pin represents the input power; $C_{PS}(Pin)$ represents the gain phase correction value corresponding to Pin; $P_X[Pin+\text{Cor}(Pin)]$ represents a phase of the RF amplifier corresponding to the corrected power.

4. The method according to claim 3, wherein the characteristic curve comprises the first relationship between the gain amplitude and the input power of the RF amplifier and the second relationship between the gain phase and the input power of the RF amplifier.

5. The method according to claim 1, wherein the first relationship and the second relationship are stored in the exciter.

6. The method according to claim 5, wherein the first relationship and the second relationship are stored as a lookup table.

7. The method according to claim 1, wherein the characteristic curve comprises the first relationship between the gain amplitude and the input power of the RF amplifier and the second relationship between the gain phase and the input power of the RF amplifier.

8. A device for pre-distorting an exciter, the device comprising:

a unit configured to obtain a characteristic curve of an amplifier;

a unit configured to obtain a first relationship between a gain amplitude correction value and an input power and a second relationship between a gain phase correction value and the input power based on the characteristic curve;

a unit configured to obtain a transmission gain for use in a scan from a magnetic resonance pre-scan;

a unit configured to obtain the gain amplitude correction value and the gain phase correction value of an input of the exciter based on the input of the exciter, the transmission gain, the first relationship, and the second relationship; and a unit configured to pre-distort the input of the exciter using the gain amplitude correction value and the gain phase correction value.

9. The device according to claim 8, wherein the first relationship is obtained through iterating the following equation:

$$\text{Cor}(Pin)+G_x[Pin+\text{Cor}(Pin)]=0$$

wherein, Pin represents the input power; Cor(Pin) represents the gain amplitude correction value corresponding to Pin; and $G_x[Pin+\text{Cor}(Pin)]$ represents a gain amplitude of the amplifier corresponding to a corrected power.

10. The device according to claim 9, wherein the second relationship is obtained through the following equation:

$$C_{PS}(Pin)+P_X[Pin+\text{Cor}(Pin)]=0$$

wherein, Pin represents the input power; $C_{PS}(Pin)$ represents the gain phase correction value corresponding to Pin; and $P_X[Pin+\text{Cor}(Pin)]$ represents a phase of the amplifier corresponding to the corrected power.

11. The device according to any one of claim 10, wherein the characteristic curve comprises the first relationship between the gain amplitude and the input power of the RF amplifier and the second relationship between the gain phase and the input power of the RF amplifier.

12. The device according to claim 8, wherein the first relationship and the second relationship are stored in the exciter.

13. The device according to claim 12, wherein the first relationship and the second relationship are stored as a lookup table.

14. The device according to claim 8, wherein the characteristic curve comprises the first relationship between the gain amplitude and the input power of the amplifier and the second relationship between the gain phase and the input power of the amplifier.

15. A predistortion exciter, comprising:

a direct digital frequency synthesizer;
a modulator;
a mixer;
a transmission chain gain amplifier;
an adder; and
a predistorter configured to store a first relationship between a gain amplitude correction value and input power and a second relationship between a gain phase correction value of the predistortion exciter and the input power, and to obtain the gain amplitude correction value and the gain phase correction value based on a transmission gain, an input of the predistortion exciter, the first relationship, and the second relationship, the transmission gain for use in a scan obtained from a magnetic resonance pre-scan, wherein the adder is configured to receive the gain phase correction value and the input of the predistortion exciter, and to output a signal to the direct digital frequency synthesizer;

an output of the direct digital frequency synthesizer is connected to an input of the modulator;

the modulator is configured to receive an amplitude of the input of the predistortion exciter, wherein the amplitude is corrected by the gain amplitude correction value, and to output a signal to the mixer; and the predistortion exciter is configured to output an output of the mixer that is multiplied by the transmission gain to a radio frequency (RF) amplifier.

16. The predistortion exciter according to claim 15, wherein the first relationship is obtained through iterating the following equation:

$$\text{Cor}(Pin)+G_x[Pin+\text{Cor}(Pin)]=0$$

wherein, Pin represents the input power; Cor(Pin) represents the gain amplitude correction value corresponding to Pin; and $G_x[Pin+\text{Cor}(Pin)]$ represents a gain amplitude of the RF amplifier corresponding to a corrected power.

17. The method according to claim 16, wherein the second relationship is obtained through the following equation:

$$C_{PS}(Pin)+P_X[Pin+\text{Cor}(Pin)]=0$$

wherein, Pin represents the input power; $C_{PS}(Pin)$ represents the gain phase correction value corresponding to Pin; and $P_X[\text{Pin}+\text{Cor}(\text{Pin})]$ represents a phase of the RF amplifier corresponding to the corrected power.

18. The predistortion exciter according to claim 17, wherein the first relationship and the second relationship are stored as a lookup table.

19. The predistortion exciter according to claim 15, further comprising a unit configured to obtain a characteristic curve of the RF amplifier, the first relationship and the second relationship obtained based on the characteristic curve.

20. The predistortion exciter according to claim 19, wherein the characteristic curve comprises the first relationship between the gain amplitude and the input power of the RF amplifier and the second relationship between the gain phase and the input power of the RF amplifier.

* * * * *